US011391982B2

United States Patent
Yang et al.

(10) Patent No.: US 11,391,982 B2
(45) Date of Patent: Jul. 19, 2022

(54) QUANTUM DOT COLOR FILTER SUBSTRATE INCLUDING TWO SUB-PIXEL AREAS HAVING SAME MATERIAL AND METHOD OF MANUFACTURING SAME

(71) Applicant: WUHAN CHINA STAR OPTOELECTRONICS TECHNOLOGY CO., LTD., Wuhan (CN)

(72) Inventors: Chaoqun Yang, Wuhan (CN); Changchih Huang, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 70 days.

(21) Appl. No.: 16/461,975

(22) PCT Filed: Jan. 17, 2019

(86) PCT No.: PCT/CN2019/072080
§ 371 (c)(1),
(2) Date: May 17, 2019

(87) PCT Pub. No.: WO2020/107681
PCT Pub. Date: Jun. 4, 2020

(65) Prior Publication Data
US 2020/0241356 A1    Jul. 30, 2020

(30) Foreign Application Priority Data
Nov. 30, 2018    (CN) .......................... 201811455682.X

(51) Int. Cl.
*G02F 1/1335* (2006.01)
*G02F 1/13357* (2006.01)
(Continued)

(52) U.S. Cl.
CPC ...... *G02F 1/133516* (2013.01); *G02F 1/1336* (2013.01); *G02F 1/134309* (2013.01);
(Continued)

(58) Field of Classification Search
CPC combination set(s) only.
See application file for complete search history.

(56) References Cited

U.S. PATENT DOCUMENTS 6,083,649 A  *  7/2000  Takeshita ............... B41M 5/265
                                                     430/200
2014/0160408 A1    6/2014  Cho et al.
(Continued)

FOREIGN PATENT DOCUMENTS

| CN | 103226260 A | 7/2013 |
| CN | 103728837 A | 4/2014 |

(Continued)

*Primary Examiner* — Lauren Nguyen
(74) *Attorney, Agent, or Firm* — Osha Bergman Watanabe & Burton LLP

(57) ABSTRACT

A quantum dot color filter substrate, and a method of manufacturing the same are provided. The quantum dot color filter substrate includes a substrate. The substrate includes a plurality of first sub-pixel areas, a plurality of second sub-pixel areas, and a plurality of third sub-pixel areas. Material of the plurality of second sub-pixel areas and material of the plurality of third sub-pixel areas are same, and the material of the plurality of second sub-pixel areas and the plurality of third sub-pixel areas is different from material of the plurality of first sub-pixel areas.

8 Claims, 7 Drawing Sheets

(51) Int. Cl.
  *G02F 1/1343*  (2006.01)
  *H01L 33/06*  (2010.01)
  *B82Y 20/00*  (2011.01)

(52) U.S. Cl.
  CPC .............. *H01L 33/06* (2013.01); *B82Y 20/00* (2013.01); *G02F 1/133614* (2021.01); *G02F 1/134345* (2021.01)

(56) References Cited

U.S. PATENT DOCUMENTS

| | | |
|---|---|---|
| 2016/0011506 A1 | 1/2016 | Gu et al. |
| 2017/0059902 A1 | 3/2017 | Guo et al. |
| 2017/0176816 A1* | 6/2017 | Han .................. G02F 1/133514 |
| 2017/0254933 A1 | 9/2017 | Li |
| 2017/0254934 A1 | 9/2017 | Liang et al. |
| 2017/0255056 A1 | 9/2017 | Liu |
| 2018/0031909 A1 | 2/2018 | Liu |
| 2018/0157083 A1* | 6/2018 | Yeo ....................... G06F 3/0412 |

FOREIGN PATENT DOCUMENTS

| | | |
|---|---|---|
| CN | 105116604 A | 12/2015 |
| CN | 105242448 A | 1/2016 |
| CN | 105242449 A | 1/2016 |
| CN | 105319765 A | 2/2016 |
| CN | 105355726 A | 2/2016 |
| CN | 106597813 A | 4/2017 |
| CN | 108828832 A | 11/2018 |

\* cited by examiner

QUANTUM DOT COLOR FILTER SUBSTRATE INCLUDING TWO SUB-PIXEL AREAS HAVING SAME MATERIAL AND METHOD OF MANUFACTURING SAME

FIELD OF INVENTION

The present disclosure relates to display technologies, and more particularly, to a quantum dot color filter substrate, and a method of manufacturing the same.

BACKGROUND OF INVENTION

An absorption wavelength and an emission wavelength of a quantum dot material vary with dot size. The quantum dot material has advantages of a concentrated luminescence spectrum, high color purity, and easy adjustment of luminescent colors by the dot size, a structure or a composition of the quantum dot material. A display device equipped with the quantum dot material can effectively improve color gamut and color reproduction capability thereof.

Quantum dot liquid crystal display devices rely on quantum dot materials to perform color display by recombination emission of electrons and holes under excitation of a backlight. The quantum dot material has a wide absorption peak and a narrow emission peak, so that it can exhibit higher purity in color display, thereby improving the color gamut of the liquid crystal display device and increasing competitiveness of the liquid crystal display panel.

In existing quantum dot liquid crystal display devices, a red quantum dot material, a green quantum dot material, and a blue quantum dot material in a quantum dot layer need to be separately prepared in different processes. The processes are complicated, and productivity is low.

Patent No. CN105301827A discloses a method for preparing a quantum dot color filter substrate and a quantum dot color filter substrate. A core of which is to provide a quantum dot color filter substrate including a substrate, a filter layer, and a quantum dot layer. The quantum dot layer includes a first quantum dot layer on a red sub-pixel region and a green sub-pixel region, and a second quantum dot layer on a blue sub-pixel region. The quantum dot layer is formed by a quantum dot glue. The quantum dot glue is obtained by mixing a red quantum dot material, a green quantum dot material, and a photo-initiator in a thermosetting glue. It is also disclosed that the red quantum dot material and the green quantum dot material in the first quantum dot layer emit red light and green light respectively under blue excitation. A quantum dot material in the second quantum dot layer does not emit light under illumination. However, a technical process is still complicated and productivity is low.

Therefore, prior art has drawbacks and is in urgent need of improvement.

SUMMARY OF INVENTION

In view of the above, the present disclosure provides a quantum dot color filter substrate, and a method of manufacturing the same to solve aforementioned issues.

In order to achieve above-mentioned object of the present disclosure, one embodiment of the disclosure provides a quantum dot color filter substrate including a substrate. The substrate includes a plurality of first sub-pixel areas, a plurality of second sub-pixel areas, and a plurality of third sub-pixel areas.

Material of the plurality of second sub-pixel areas and material of the plurality of third sub-pixel areas are same, and the material of the plurality of second sub-pixel areas and the plurality of third sub-pixel areas is different from material of the plurality of first sub-pixel areas.

In one embodiment of the quantum dot color filter substrate of the disclosure, the plurality of first sub-pixel areas of the substrate includes a blue quantum dot material.

In one embodiment of the disclosure, the quantum dot color filter substrate further includes a layer of green filter film disposed on the plurality of second sub-pixel areas, and a layer of red filter film disposed on the plurality of third sub-pixel areas.

In one embodiment of the disclosure, the quantum dot color filter substrate further includes a black matrix configured to separate the plurality of first sub-pixel areas, the plurality of second sub-pixel areas and the plurality of third sub-pixel areas.

In one embodiment of the quantum dot color filter substrate of the disclosure, the material of the plurality of second sub-pixel areas and the plurality of third sub-pixel areas includes a red quantum dot material and a green quantum dot material.

One embodiment of the disclosure further provides a quantum dot display panel including a blue light backlight module, a quantum dot color filter substrate disposed on the blue light backlight module, and a liquid crystal panel disposed on the quantum dot color filter substrate.

The quantum dot color filter substrate includes a substrate. The substrate includes a plurality of first sub-pixel areas, a plurality of second sub-pixel areas, and a plurality of third sub-pixel areas.

Material of the plurality of second sub-pixel areas and material of the plurality of third sub-pixel areas are same, and the material of the plurality of second sub-pixel areas and the plurality of third sub-pixel areas is different from material of the plurality of first sub-pixel areas.

In one embodiment of the quantum dot display panel of the disclosure, the plurality of first sub-pixel areas of the substrate includes a blue quantum dot material.

In one embodiment of the disclosure, the quantum dot display panel further includes a layer of green filter film disposed on the plurality of second sub-pixel areas, and a layer of red filter film disposed on the plurality of third sub-pixel areas.

In one embodiment of the disclosure, quantum dot display panel further includes a black matrix configured to separate the plurality of first sub-pixel areas, the plurality of second sub-pixel areas and the plurality of third sub-pixel areas.

In one embodiment of the quantum dot display panel of the disclosure, the material of the plurality of second sub-pixel areas and the plurality of third sub-pixel areas includes a red quantum dot material and a green quantum dot material.

One embodiment of the disclosure further provides a method of manufacturing a quantum dot color filter substrate including steps of:

step S1: providing a substrate, wherein the substrate includes a plurality of first sub-pixel areas, a plurality of second sub-pixel areas, and a plurality of third sub-pixel areas;

step S2: coating a photoresist material on the substrate, wherein the photoresist material includes a second quantum dot material and a third quantum dot material; and step S3: patterning the photoresist material to remove the photoresist material on the plurality of first sub-pixel areas.

In one embodiment of the disclosure of the method of manufacturing the quantum dot color filter substrate, the substrate includes a layer of first quantum dot material disposed on the plurality of first sub-pixel areas of the substrate.

In one embodiment of the disclosure of the method of manufacturing the quantum dot color filter substrate, in the step of providing a substrate, the substrate further includes a layer of green filter film disposed on the plurality of second sub-pixel areas, and a layer of red filter film disposed on the plurality of third sub-pixel areas.

In one embodiment of the disclosure of the method of manufacturing the quantum dot color filter substrate, the step of patterning the photoresist material further includes steps of exposing, developing and baking the photoresist material.

In one embodiment of the disclosure of the method of manufacturing the quantum dot color filter substrate, in the step of providing a substrate, the substrate further includes a black matrix configured to separate the plurality of first sub-pixel areas, the plurality of second sub-pixel areas and the plurality of third sub-pixel areas.

In one embodiment of the disclosure of the method of manufacturing the quantum dot color filter substrate, a ratio of mixing of the second quantum dot material and the third quantum dot material is adjusted according to product demand.

In one embodiment of the disclosure of the method of manufacturing the quantum dot color filter substrate, the first quantum dot material is a blue quantum dot material.

In one embodiment of the disclosure of the method of manufacturing the quantum dot color filter substrate, the second quantum dot material is a green quantum dot material, and the third quantum dot material is a red quantum dot material.

One embodiment of the disclosure further provides a method of manufacturing a quantum dot display panel including steps of:

step P1: providing a blue light backlight module;

step P2: providing a quantum dot color filter substrate disposed on the blue light backlight module; and step P3: providing a liquid crystal panel disposed on the quantum dot color filter substrate, wherein a method of manufacturing the quantum dot color filter substrate includes steps of:

step S1: providing a substrate, wherein the substrate includes a plurality of first sub-pixel areas, a plurality of second sub-pixel areas, and a plurality of third sub-pixel areas;

step S2: coating a photoresist material on the substrate, wherein photoresist material includes a second quantum dot material and a third quantum dot material; and step S3: patterning the photoresist material to remove the photoresist material on the plurality of first sub-pixel areas.

In one embodiment of the disclosure of the method of manufacturing the quantum dot display panel, the substrate includes a layer of first quantum dot material disposed on the plurality of first sub-pixel areas of the substrate.

In one embodiment of the disclosure of the method of manufacturing the quantum dot display panel, in the step of providing a substrate, the substrate further includes a layer of green filter film disposed on the plurality of second sub-pixel areas, and a layer of red filter film disposed on the plurality of third sub-pixel areas.

In one embodiment of the disclosure of the method of manufacturing the quantum dot display panel, in the step of providing a substrate, the substrate further includes a black matrix configured to separate the plurality of first sub-pixel areas, the plurality of second sub-pixel areas and the plurality of third sub-pixel areas.

In comparison with the prior art, one embodiment of the disclosure provides the quantum dot color filter substrate. Material of the plurality of second sub-pixel areas and material of the plurality of third sub-pixel areas are same, and the material of the plurality of second sub-pixel areas and the plurality of third sub-pixel areas is different from material of the plurality of first sub-pixel areas. It insures a display color and saving one process to improve a yield by produce the quantum dot material on the red sub-pixel area and the green sub-pixel area with the same photo mask in photolithography process and adjusting a ratio of mixing of the second quantum dot material and the third quantum dot material according to product demand.

DETAILED DESCRIPTION OF PREFERRED EMBODIMENTS

The following description of the embodiments is provided by reference to the following drawings and illustrates the specific embodiments of the present disclosure. Directional terms mentioned in the present disclosure, such as "up," "down," "top," "bottom," "forward," "backward," "left," "right," "inside," "outside," "side," "peripheral," "central," "horizontal," "peripheral," "vertical," "longitudinal," "axial," "radial," "uppermost" or "lowermost," etc., are merely indicated the direction of the drawings. Therefore, the directional terms are used for illustrating and understanding of the application rather than limiting thereof.

Figure 6:
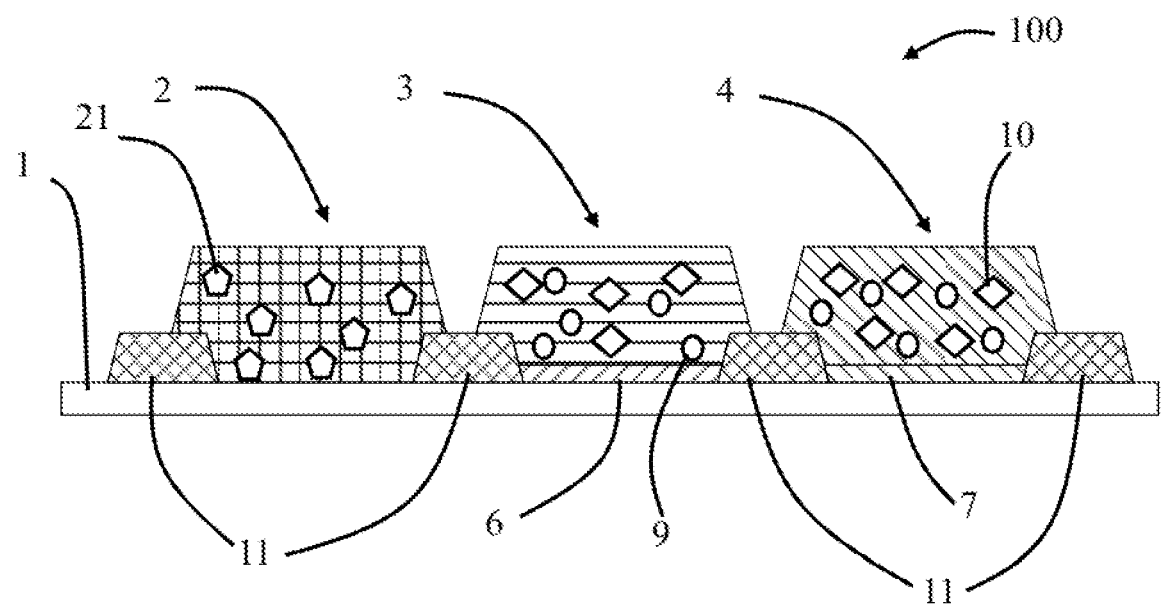
FIG. 6 is a schematic view of a development process of step 3 of a method of manufacturing a quantum dot color filter substrate according to an embodiment of the present disclosure.

Referring to FIG. 6, one embodiment of the disclosure provides a quantum dot color filter substrate 100 including a substrate 1.

The substrate 1 includes a plurality of first sub-pixel areas 2, a plurality of second sub-pixel areas 3, and a plurality of third sub-pixel areas 4.

In detail, the plurality of first sub-pixel areas 2 are, for example, blue sub-pixel areas, the plurality of second sub-pixel areas 3 are, for example, green sub-pixel areas, and the plurality of third sub-pixel areas 4 are, for example, red sub-pixel areas. The present invention is not limited thereto. One of ordinary skill in the art can appropriately select different color combinations as described herein.

Material of the plurality of second sub-pixel areas 3 and material of the plurality of third sub-pixel areas 4 are same, and the material of the plurality of second sub-pixel areas 3, and the plurality of third sub-pixel areas 4 is different from material of the plurality of first sub-pixel areas 2.

In one embodiment of the quantum dot color filter substrate 100 of the disclosure, the plurality of first sub-pixel areas 2 include a first quantum dot material 21. The first quantum dot material is a blue quantum dot material.

In one embodiment of the disclosure, the quantum dot color filter substrate 100 further includes a layer of green filter film 6 disposed on the plurality of second sub-pixel areas 3, and a layer of red filter film 7 disposed on the plurality of third sub-pixel areas 4.

In one embodiment of the disclosure, the quantum dot color filter substrate 100 further includes a black matrix 11 configured to separate the plurality of first sub-pixel areas 2, the plurality of second sub-pixel areas 3, and the plurality of third sub-pixel areas 4.

In one embodiment of the quantum dot color filter substrate 100 of the disclosure, the material of the plurality of second sub-pixel areas 3, and the plurality of third sub-pixel areas 4 includes a third quantum dot material 9 and a second quantum dot material 10. The third quantum dot material 9 is a red quantum dot material and the second quantum dot material 10 is a green quantum dot material. The present invention is not limited thereto. One of ordinary skill in the art can appropriately select different color combinations as described herein.

Figure 1:
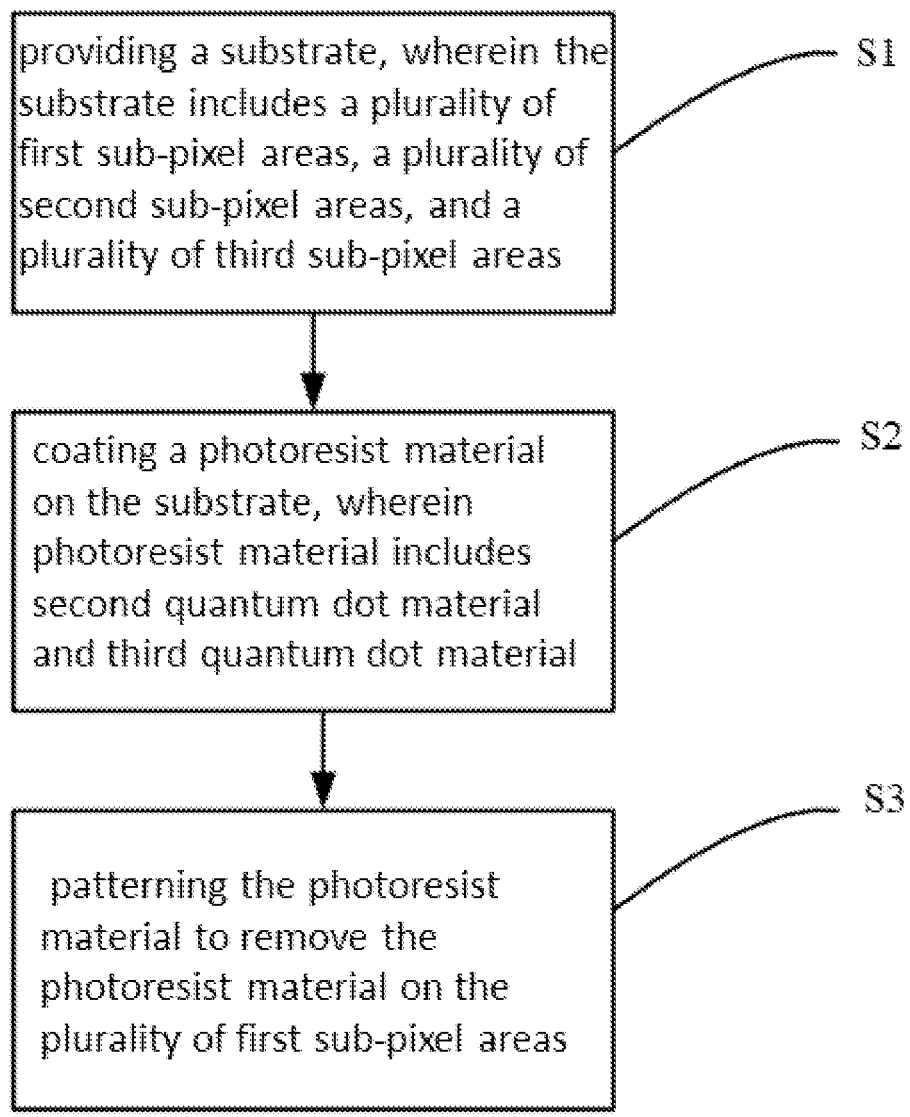
FIG. 1 is a schematic flowchart of a method of manufacturing a quantum dot color filter substrate according to an embodiment of the present disclosure.

Please refer to FIG. 1, FIG. 1 is a flowchart of a method of manufacturing a quantum dot color filter substrate according to an embodiment of the present disclosure. One embodiment of the disclosure further provides a method of manufacturing the quantum dot color filter substrate including steps of:

step S1: providing a substrate, wherein the substrate includes a plurality of first sub-pixel areas, a plurality of second sub-pixel areas, and a plurality of third sub-pixel areas;

step S2: coating a photoresist material on the substrate, wherein the photoresist material includes a second quantum dot material and a third quantum dot material; and step S3: patterning the photoresist material to remove the photoresist material on the plurality of first sub-pixel areas.

Figure 3:
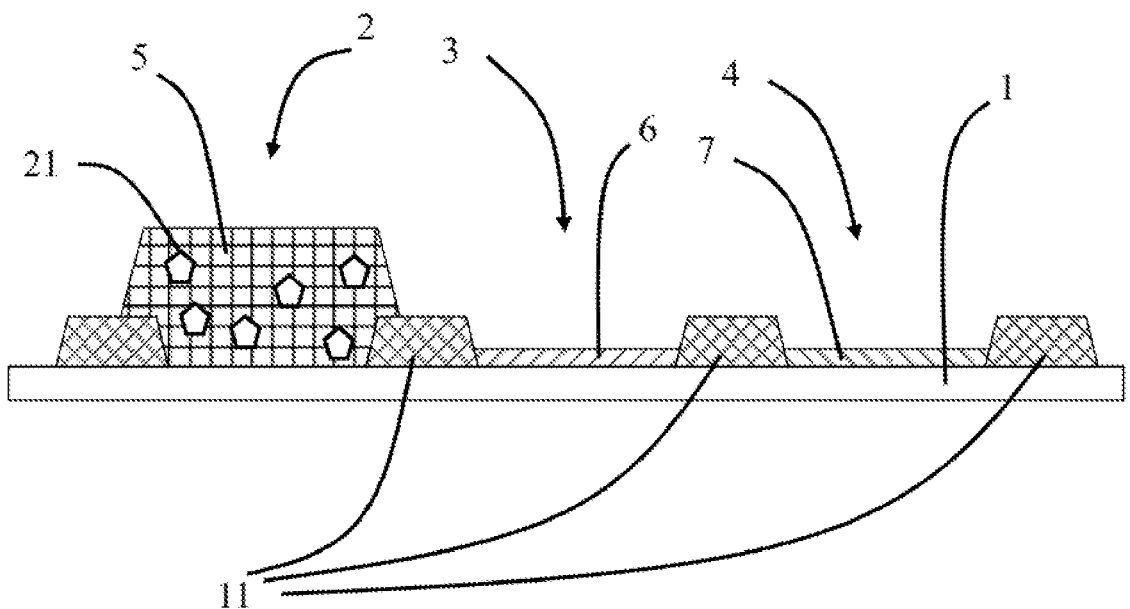
FIG. 3 is a schematic view of step 1 of a method of manufacturing a quantum dot color filter substrate according to an embodiment of the present disclosure.
Figure 4:
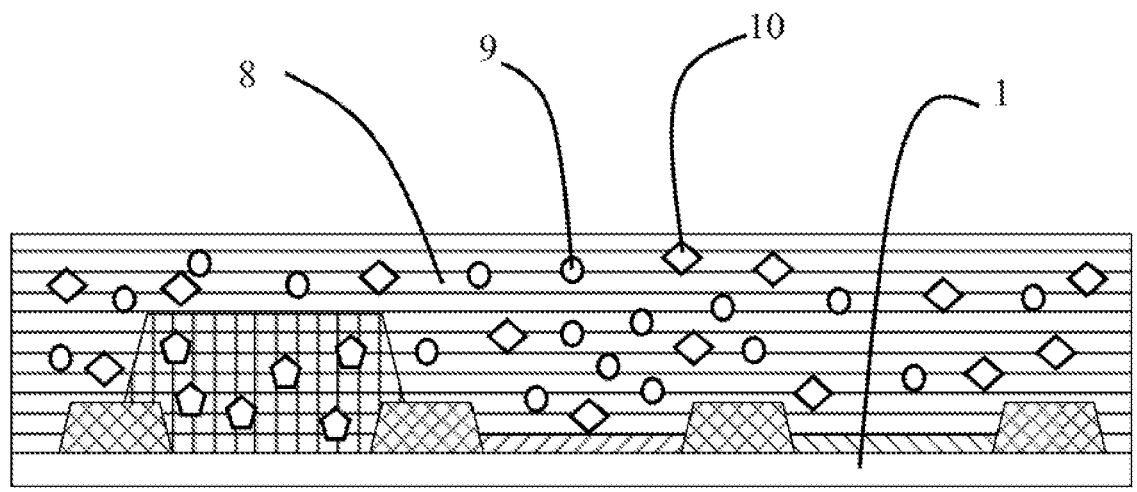
FIG. 4 is a schematic view of step 2 of a method of manufacturing a quantum dot color filter substrate according to an embodiment of the present disclosure.

Please refer to FIG. 3, in detail, step S1 of the method of manufacturing the quantum dot color filter substrate includes providing a substrate 1, wherein the substrate includes a plurality of first sub-pixel areas 2, a plurality of second sub-pixel areas 3, and a plurality of third sub-pixel areas 4.

In detail, the plurality of first sub-pixel areas 2 are, for example, blue sub-pixel areas, the plurality of second sub-pixel areas 3 are, for example, green sub-pixel areas, and the plurality of third sub-pixel areas 4 are, for example, red sub-pixel areas. The present invention is not limited thereto. One of ordinary skill in the art can appropriately select different color combinations as described herein.

In one embodiment of the disclosure of the method of manufacturing the quantum dot color filter substrate, the substrate includes a layer of first quantum dot material 5 disposed on the plurality of first sub-pixel areas 2 of the substrate 1.

In one embodiment of the disclosure of the method of manufacturing the quantum dot color filter substrate, in the step S1 of providing a substrate, the substrate 1 further includes a layer of green filter film 6 disposed on the plurality of second sub-pixel areas 3, and a layer of red filter film 7 disposed on the plurality of third sub-pixel areas 4.

Figure 5:
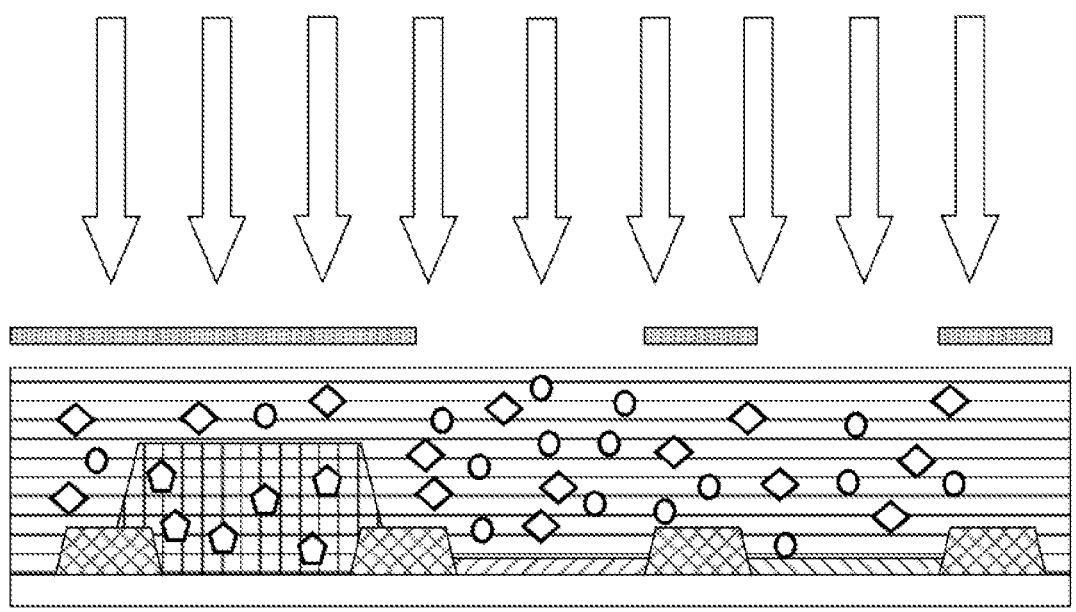
FIG. 5 is a schematic view of an exposure process of step 3 of a method of manufacturing a quantum dot color filter substrate according to an embodiment of the present disclosure.

Please refer to FIGS. 5 and 6, a way of patterning the photoresist material of the method of manufacturing the quantum dot color filter substrate can be photolithography or other methods.

The step S3 further includes step S3-1: exposing the photoresist material, and step S3-2: developing and baking the photoresist material.

In one embodiment of the disclosure of the method of manufacturing the quantum dot color filter substrate, in the step S1: providing a substrate, the substrate further includes a black matrix 11 configured to separate the plurality of first sub-pixel areas 2, the plurality of second sub-pixel areas 3, and the plurality of third sub-pixel areas 4.

In one embodiment of the disclosure of the method of manufacturing the quantum dot color filter substrate, a ratio of mixing of the second quantum dot material 10 and the third quantum dot material 9 is adjusted according to product demand.

In detail, the plurality of first sub-pixel areas 2 are, for example, blue sub-pixel areas, the plurality of second sub-pixel areas 3 are, for example, green sub-pixel areas, and the plurality of third sub-pixel areas 4 are, for example, red sub-pixel areas. The present invention is not limited thereto. One of ordinary skill in the art can appropriately select different color combinations as described herein.

In detail, the quantum dot material includes at least one of a Group II-VI quantum dot material and a Group quantum dot material. In detail, the quantum dot material includes at least one of $ZnCdSe_2$, CdSe, CdTe, $CuInS_2$, or $ZnCuInS_3$.

Figure 2:
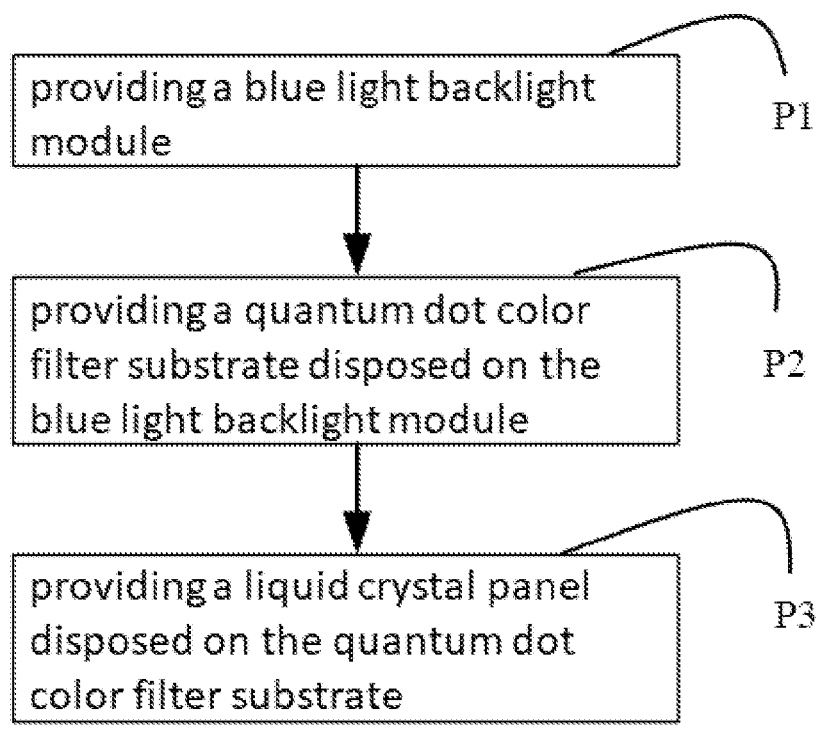
FIG. 2 is a schematic flowchart of a method of manufacturing a quantum dot color filter substrate according to an embodiment of the present disclosure.

Please refer to FIGS. 1 and 2, one embodiment of the disclosure further provides a method of manufacturing a quantum dot display panel including steps of:

step P1: providing a blue light backlight module;

step P2: providing a quantum dot color filter substrate disposed on the blue light backlight module; and step P3: providing a liquid crystal panel disposed on the quantum dot color filter substrate, wherein a method of manufacturing the quantum dot color filter substrate includes steps of:

step S1: providing a substrate, wherein the substrate includes a plurality of first sub-pixel areas, a plurality of second sub-pixel areas, and a plurality of third sub-pixel areas;

step S2: coating a photoresist material on the substrate, wherein photoresist material includes a second quantum dot material and a third quantum dot material; and step S3: patterning the photoresist material to remove the photoresist material on the plurality of first sub-pixel areas.

In detail, the plurality of first sub-pixel areas 2 are, for example, blue sub-pixel areas, the plurality of second sub-pixel areas 3 are, for example, green sub-pixel areas, and the plurality of third sub-pixel areas 4 are, for example, red sub-pixel areas. The present invention is not limited thereto.

One of ordinary skill in the art can appropriately select different color combinations as described herein.

In detail, the first quantum dot material 5 is a blue quantum dot material, the second quantum dot material 10 is a green quantum dot material and the third quantum dot material 9 is a red quantum dot material. The present invention is not limited thereto. One of ordinary skill in the art can appropriately select different color combinations as described herein.

Figure 7:
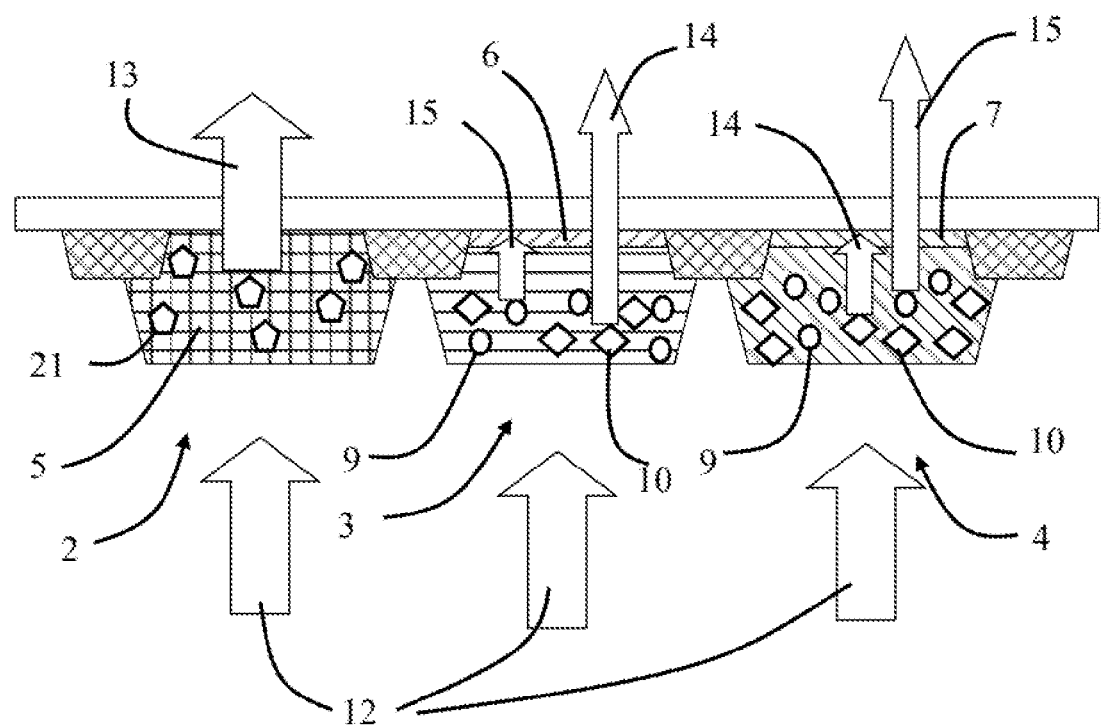
FIG. 7 is a schematic view showing an application mode of a quantum dot color filter substrate according to an embodiment of the present disclosure.

Please refer to FIG. 7, an application mode of the quantum dot color filter substrate of the present disclosure. In detail, when a blue light beam 12 emitted by a blue backlight module passes through the quantum dot color filter substrate of the present disclosure, the blue light beam 12 passes through a blue quantum dot material 5 of blue sub-pixel areas 2 to excite the blue quantum dot material 5 to emit blue light 13.

The blue light beam 12 passes through a red quantum dot material 9 and a green quantum dot material 10 of a green sub-pixel region 3, and the red quantum dot material 9 and the green quantum dot material 10 are excited to emit red light 15 and green light 14. Then, when the red light 15 and the green light 14 pass through the green filter film 6, the red light 15 is filtered out and only the green light 14 passes.

The blue light beam 12 passes through the red quantum dot material 9 and the green quantum dot material 10 of a red sub-pixel region 4, and the red quantum dot material 9 and the green quantum dot material 10 are excited to emit red light 15 and green light 14. Then, when the red light 15 and the green light 14 pass through the red color filter film 7, the green light 14 is filtered out and only the red light 15 passes.

Figure 8:
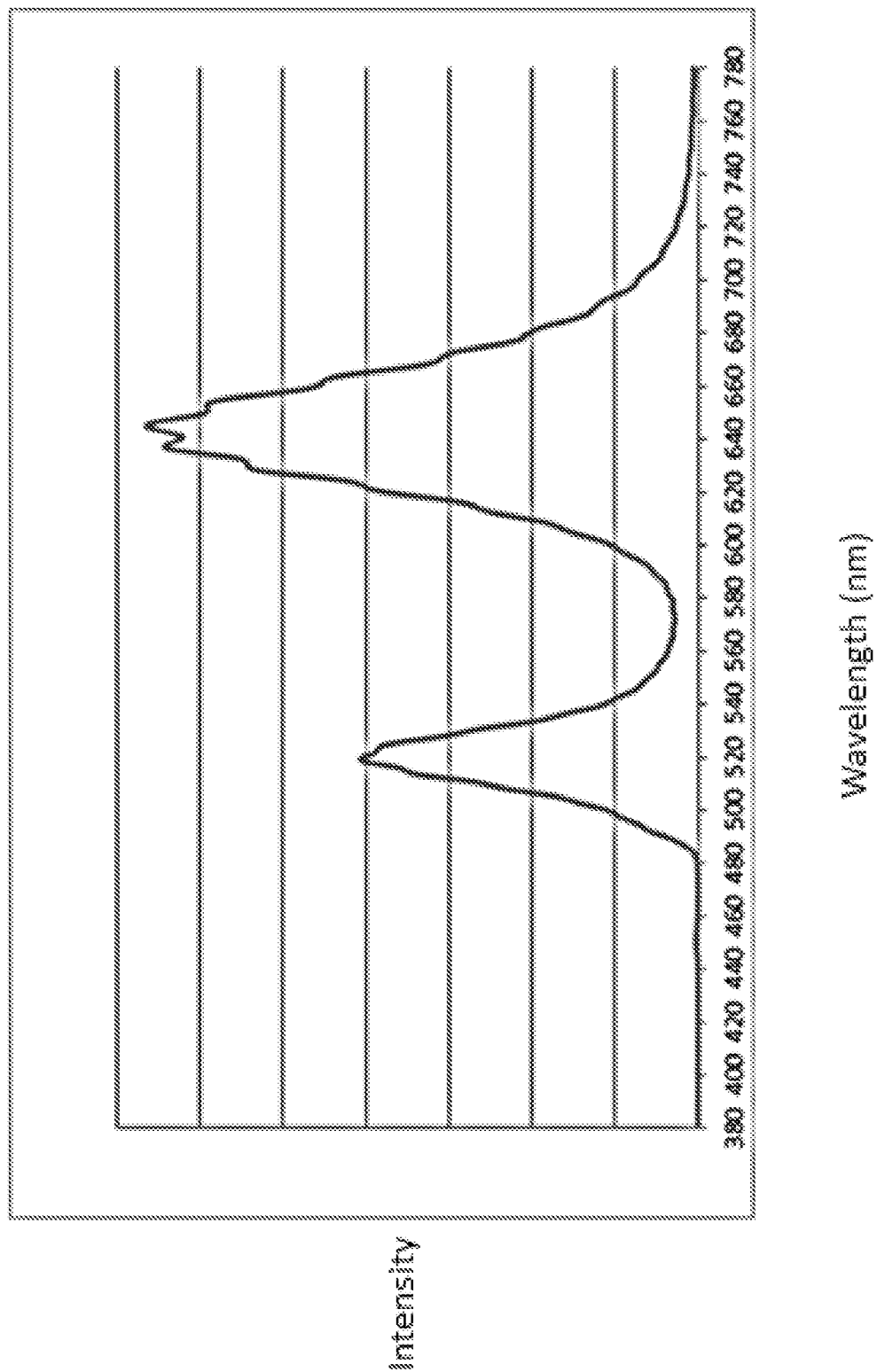
FIG. 8 is a spectrum diagram of excitation light of a photoresist material of a quantum dot color filter substrate after being irradiated with blue light.
Figure 9:
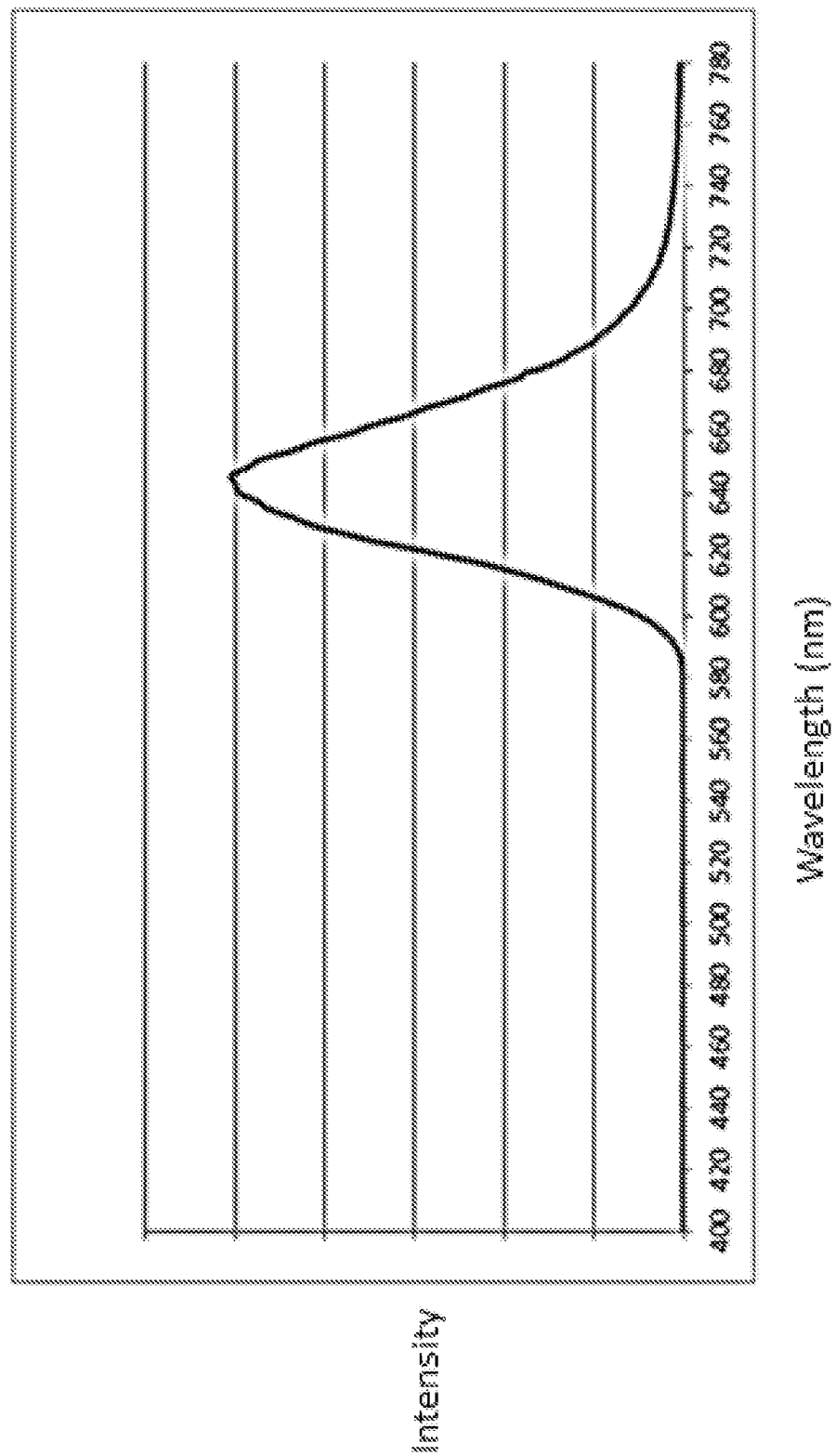
FIG. 9 is a spectrum diagram of excitation light of a photoresist material of a quantum dot color filter substrate through the red filter after the photoresist material is irradiated with blue light.
Figure 10:
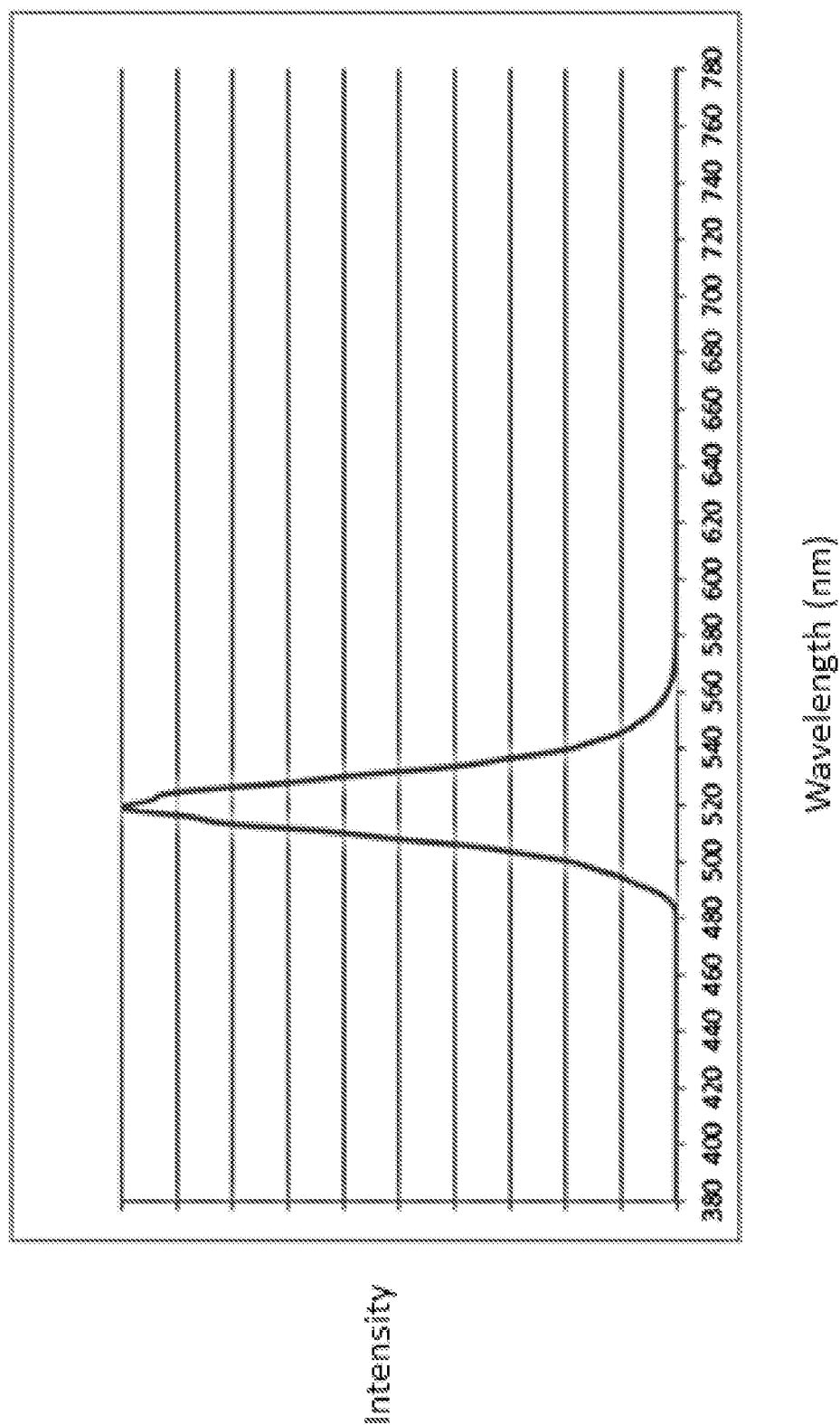
FIG. 10 is a spectrum diagram of excitation light of a photoresist material of a quantum dot color filter substrate through the green filter after the photoresist material is irradiated with blue light.

Please refer to FIG. 8-10, it can be seen from a spectrum of FIG. 8 of excitation light of the photoresist of the quantum dot color film substrate illuminated by blue light that the excitation light contains red and green components.

It can be seen from a spectrum of FIG. 9 of excitation light of the photoresist of the quantum dot color film substrate illuminated by blue light passing through the red color filter film that the excitation red light and green light passing through the red color filter film contains only red components.

It can be seen from a spectrum of FIG. 10 of excitation light of the photoresist of the quantum dot color film substrate illuminated by blue light passing through the green color filter film that the excitation red light and green light passing through the green color filter film contains only green components.

In comparison with the prior art, one embodiment of the disclosure provides the quantum dot color filter substrate. It insures a display color and saving one process to improve a yield by produce the quantum dot material on the red sub-pixel area and the green sub-pixel area with the same photo mask in photolithography process and adjusting a ratio of mixing of the second quantum dot material and the third quantum dot material according to product demand.

The present disclosure has been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. A quantum dot color filter substrate, comprising:
a substrate, wherein the substrate comprises:
a plurality of first sub-pixel areas;
a plurality of second sub-pixel areas; and
a plurality of third sub-pixel areas, wherein a material of the plurality of first sub-pixel areas comprises a first quantum dot material, a material of the plurality of second sub-pixel areas comprises a mixture of a second quantum dot material and a third quantum dot material, a material of the plurality of third sub-pixel areas is same as the material of the plurality of second sub-pixel areas, and the material of the plurality of second sub-pixel areas and the plurality of third sub-pixel areas comprises a red quantum dot material and a green quantum dot material and is different from the material of the plurality of first sub-pixel areas.

2. The quantum dot color filter substrate according to claim 1, wherein the material of the plurality of first sub-pixel areas of the substrate comprises a blue quantum dot material.

3. The quantum dot color filter substrate according to claim 1, further comprising a layer of green filter film disposed on the plurality of second sub-pixel areas and a layer of red filter film disposed on the plurality of third sub-pixel areas.

4. The quantum dot color filter substrate according to claim 1, further comprising a black matrix configured to separate the plurality of first sub-pixel areas, the plurality of second sub-pixel areas, and the plurality of third sub-pixel areas.

5. A quantum dot display panel, comprising:
a blue light backlight module;
a quantum dot color filter substrate disposed on the blue light backlight module; and
a liquid crystal panel disposed on the quantum dot color filter substrate, wherein the quantum dot color filter substrate comprises:
a substrate, wherein the substrate comprises:
a plurality of first sub-pixel areas;
a plurality of second sub-pixel areas; and
a plurality of third sub-pixel areas, wherein a material of the plurality of first sub-pixel areas comprises a first quantum dot material, a material of the plurality of second sub-pixel areas comprises a mixture of a second quantum dot material and a third quantum dot material, a material of the plurality of third sub-pixel areas is same as the material of the plurality of second sub-pixel areas, and the material of the plurality of second sub-pixel areas and the plurality of third sub-pixel areas comprises a red quantum dot material and a green quantum dot material and is different from the material of the plurality of first sub-pixel areas.

6. The quantum dot display panel according to claim 5, wherein the material of the plurality of first sub-pixel areas of the substrate comprises a blue quantum dot material.

7. The quantum dot display panel according to claim 5, further comprising a layer of green filter film disposed on the plurality of second sub-pixel areas, and a layer of red filter film disposed on the plurality of third sub-pixel areas.

8. The quantum dot display panel according to claim 5, further comprising a black matrix configured to separate the plurality of first sub-pixel areas, the plurality of second sub-pixel areas, and the plurality of third sub-pixel areas.

* * * * *